United States Patent
Tseng et al.

(10) Patent No.: US 11,126,217 B1
(45) Date of Patent: Sep. 21, 2021

(54) INTEGRATED CIRCUIT WITH MIXED CIRCUITRY STRUCTURE OF STATIC COMBINATIONAL CIRCUIT AND DYNAMIC COMBINATIONAL CIRCUIT AND DESIGNING METHOD THEREOF

(71) Applicant: RDC Semiconductor Co., Ltd., Hsinchu (TW)

(72) Inventors: Chung-Ching Tseng, Hsinchu (TW); Ching-Chong Chuang, Hsinchu (TW)

(73) Assignee: RDC SEMICONDUCTOR CO., LTD., Hsinchu (TW)

( * ) Notice: Subject to any disclaimer, the term of this patent is extended or adjusted under 35 U.S.C. 154(b) by 0 days.

(21) Appl. No.: 17/020,881

(22) Filed: Sep. 15, 2020

(30) Foreign Application Priority Data

Jul. 14, 2020 (TW) .................. 109123697

(51) Int. Cl.
*H03K 3/00* (2006.01)
*G06F 1/10* (2006.01)
*H03K 3/037* (2006.01)
*G06F 1/12* (2006.01)
*G06F 1/06* (2006.01)
*H03K 5/00* (2006.01)

(52) U.S. Cl.
CPC .................. *G06F 1/10* (2013.01); *G06F 1/06* (2013.01); *G06F 1/12* (2013.01); *H03K 3/037* (2013.01); *H03K 5/00* (2013.01); *H03K 2005/00078* (2013.01)

(58) Field of Classification Search
CPC .... G06F 1/10; G06F 1/06; G06F 1/12; H03K 3/037; H03K 2005/00078; H03K 5/00

USPC ......................................................... 327/199
See application file for complete search history.

(56) References Cited

U.S. PATENT DOCUMENTS

| | | | | |
|---|---|---|---|---|
| 4,891,531 A | * | 1/1990 | Kobayashi | ........... H03K 3/0375 326/21 |
| 5,880,608 A | | 3/1999 | Mehta et al. | |
| 5,880,609 A | * | 3/1999 | Klass | ................. H03K 19/0963 326/93 |
| 5,983,013 A | * | 11/1999 | Rogers | ............... H03K 19/0963 326/96 |
| 6,018,254 A | * | 1/2000 | Rogers | ............... H03K 19/0963 326/93 |

(Continued)

OTHER PUBLICATIONS

Office Action issued by Taiwan Intellectual Property Office dated Apr. 20, 2021.

*Primary Examiner* — Ryan Jager
(74) *Attorney, Agent, or Firm* — WPAT, PC

(57) ABSTRACT

An integrated circuit includes a first stage and a second stage. The first stage receives a previous stage output data and a clock signal and generates a first output data. The second stage receives the first output data and the clock signal. The first stage includes a first flip-flop circuit, a first static combinational circuit, a dynamic combinational circuit and a multi-phase generator. The first flip-flop circuit receives the previous output data and the clock signal and generates an input data. The first static combinational circuit receives the input data and generates an intermediate data. The multi-phase generator receives the clock signal and generates a delayed clock signal. The dynamic combinational circuit receives the intermediate data and the delayed clock signal and generates the first output data.

8 Claims, 4 Drawing Sheets

(56) References Cited

U.S. PATENT DOCUMENTS

| | | | |
|---|---|---|---|
| 6,043,696 A * | 3/2000 | Klass | H03K 3/356139 |
| | | | 326/95 |
| 6,928,572 B2 | 8/2005 | Fletcher et al. | |
| 7,370,301 B2 * | 5/2008 | Bourgin | G06F 30/30 |
| | | | 716/114 |
| 7,592,840 B2 | 9/2009 | Sit et al. | |
| 7,932,750 B2 | 4/2011 | Kim | |
| 2013/0305078 A1 | 11/2013 | Lee et al. | |

* cited by examiner

INTEGRATED CIRCUIT WITH MIXED CIRCUITRY STRUCTURE OF STATIC COMBINATIONAL CIRCUIT AND DYNAMIC COMBINATIONAL CIRCUIT AND DESIGNING METHOD THEREOF This application claims the benefit of Taiwanese Patent Application No. 109123697, filed Jul. 14, 2020, the subject matter of which is incorporated herein by reference.

FIELD OF THE INVENTION

The present invention relates to an integrated circuit and a designing method, and more particularly to an integrated circuit with a mixed circuitry structure of a static combinational circuit and a dynamic combinational circuit and a designing method thereof.

BACKGROUND OF THE INVENTION

As is well known, an integrated circuit comprises plural sub-circuits for providing various functions. During the operation of the integrated circuit, each sub-circuit executes a corresponding specific function. In order to smoothly transfer data between the sub-circuits, each sub-circuit is operated according to a clock signal. In other words, the sub-circuits in the integrated circuit can be regarded as multiple stages. For example, according to the clock signal, the data generated in the first stage can be transferred to the second level for processing, and the data generated in the second stage can be sent to the third stage for processing. The rest may be deduced by analogy.

FIG. 1 is a schematic circuit block diagram illustrating a conventional integrated circuit. The integrated circuit comprises plural stages. For succinctness, only an n-th stage 110 and an (n+1)-th stage 120 are shown. These stages are operated according to a clock signal CLK. The n-th stage 110 comprises a flip-flop circuit 112 and a static combinational circuit 114. The (n+1)-th stage 120 comprises a flip-flop circuit 122 and a static combinational circuit 124. The clock input terminals CKin of the flip-flop circuits 112 and 122 receive the clock signal CLK. Moreover, each of the flip-flop circuits 112 and 122 comprises plural latches.

In the n-th stage 110, the flip-flop circuit 112 latches the output data $Dout_{n-1}$ of the previous stage as the input data $Din_n$. After the static combinational circuit 114 receives and processes the input data Dine, the output data $Dout_n$ of the n-th stage 110 is generated. Similarly, in the (n+1)-th stage 120, the flip-flop circuit 122 latches the output data $Dout_n$ of the n-th stage 110 as the input data $Din_{n+1}$. After the static combinational circuit 124 receives and processes the input data $Din_{n+1}$, the output data $Dout_{n+1}$ of the (n+1)-th stage 120 is generated.

Each of the static combinational circuits 114 and 124 composed of various static logic elements. For example, the static logic elements include NOT gates, AND gates, NAND gates, OR gates, NOR gates, XOR gate, or the like.

For example, the static combinational circuit 114 in the n-th stage 110 is an adder, the static combinational circuit 124 in the (n+1)-th stage 120 is a multiplier, and the output data $Dout_{n-1}$ contains three values A, B, and C.

In the n-th stage 110, the flip-flop circuit 112 latches the output data $Dout_{n-1}$ of the previous stage as the input data Dine, and the static combinational circuit 114 adds the value A and the value B. In addition, the outputs data $Dout_n$ contains two values (A+B) and C.

In the (n+1)-th stage 120, the flip-flop circuit 122 latches the output data $Dout_n$ as the input data $Din_{n+1}$, and the static combinational circuit 114 multiplies the value (A+B) by the value C. The output data $Dout_{n+1}$ is equal to the value (A+B)×C.

In the first cycle of the clock signal CLK, the n-th stage 110 performs an addition operation according to the output data $Dout_{n-1}$ including the three values of A, B and C, and generates the output data $Dout_n$ including two values (A+B) and C. In the second cycle of the clock signal CLK, the (n+1)-th stage 120 performs a multiplication according to the output data $Dout_n$ including two values (A+B) and C, and generating the output data $Dout_{n+1}$, i.e., (A+B)×C.

In addition to the above-mentioned adder and multiplier, the static combinational circuits 114 and 124 may be designed as various arithmetic logic circuits according to the practical requirements and perform. Consequently, the arithmetic logic circuits perform various operations according to the clock signal CLK.

After the circuit diagram of FIG. 1 is designed and before the integrated circuit is fabricated, it is necessary to perform a layout action. That is, all electronic elements of the circuit diagram are subjected to a placement and routing operation on a semiconductor substrate. Generally, the layout action is completed by using an automatic placement and routing tool, which is also referred as an APR tool.

The APR tool is a computer software that can place electronic elements of the circuit diagram on the semiconductor substrate, and then route the connections between the electronic elements. In order for the integrated circuit to operate smoothly, the APR tool also performs a clock tree balancing operation on the clock signal CLK. The clock tree balancing operation is also referred as a clock tree synthesis (CTS) operation.

Generally, the clock tree balancing operation is used to control the clock path. Consequently, the clock signals CLK received by the clock input terminals CKin of all stages are synchronous with each other. Take the integrated circuit as shown in FIG. 1 for example. After the clock tree balancing operation is completed and during the operation of the integrated circuit, the clock signals CLK received by the clock input terminals CKin of the stages 110 and 120 are switched from the low level state to the high level state synchronously or switched from the high level state to the low level state synchronously.

Generally, the dynamic combinational circuit has many advantages. For example, the dynamic combinational circuit is operated at a faster speed, the area saving efficacy is higher, and the energy consumption is lower. Consequently, the dynamic circuits have been designed in central processing units (CPU), system on chip (SOC) or application-specific integrated circuits (ASIC).

The dynamic combinational circuit is composed of various dynamic logic elements. For example, the dynamic logic elements include dynamic NOT gates, dynamic AND gates, dynamic NAND gates, dynamic OR gates, dynamic NOR gates, dynamic XOR gates, or the like.

Especially, the dynamic combinational circuit is operated according to the clock signal CLK. If the clock signal CLK is in a logic low level, the dynamic combinational circuit is in a pre-charge phase. If the clock signal CLK is in a high level state, the dynamic combinational circuit is in an evaluation phase. For example, the operations of a dynamic NAND gate will be described as follows.

FIG. 2 is a schematic circuit diagram illustrating a dynamic NAND gate. If the clock signal CLK is in a logic low level (e.g., a ground voltage GND), the dynamic NAND gate is in a pre-charge phase. Meanwhile, the transistor Mu is turned on, the transistor Md is turned off, and the capacitor C is charged to a supply voltage Vdd.

If the clock signal CLK is in a high level state (e.g., the supply voltage Vdd), the dynamic NAND gate is in an evaluation phase. Meanwhile, transistor Mu is turned off, the transistor Md is turned on, and the output data OUT is determined according to input signal A and input signal B. In case that the input signal A and the input signal B are both in the high level state, the output data OUT is in the low level state. In case that the input signal A and the input signal B are both in the low level state, the output data OUT is in the high level state. In case that one of the input signal A and the input signal B is in the low level state, the output data OUT is in the high level state.

As mentioned above, the dynamic combinational circuit composed of various dynamic logic elements is operated according to the clock signal CLK.

However, in case that both of the dynamic combinational circuit and the static combinational circuit are installed in each stage of the integrated circuit, some drawbacks occur. For example, after the APR tool also performs the clock tree balancing operation, the integrated circuit cannot be operated normally.

SUMMARY OF THE INVENTION

An embodiment of the present invention provides an integrated circuit with a mixed circuitry structure of a static combinational circuit and a dynamic combinational circuit. The integrated circuit includes a first stage and a second stage. The first stage receives a previous stage output data and a clock signal and generates a first output data. The second stage receives the first output data and the clock signal and generates a second output data. The first stage includes a first flip-flop circuit, a first static combinational circuit, a dynamic combinational circuit and a multi-phase generator. A data input terminal of the first flip-flop circuit receives the previous output data. A clock input terminal of the first flip-flop circuit receives the clock signal. A data output terminal of the first flip-flop circuit generates an input data. The first static combinational circuit receives the input data and generates an intermediate data. The multi-phase generator receives the clock signal and generates a delayed clock signal. A data input terminal of the dynamic combinational circuit receives the intermediate data. A clock input terminal of the dynamic combinational circuit receives the delayed clock signal. A data output terminal of the dynamic combinational circuit generates the first output data.

Numerous objects, features and advantages of the present invention will be readily apparent upon a reading of the following detailed description of embodiments of the present invention when taken in conjunction with the accompanying drawings. However, the drawings employed herein are for the purpose of descriptions and should not be regarded as limiting.

BRIEF DESCRIPTION OF THE DRAWINGS

The above objects and advantages of the present invention will become more readily apparent to those ordinarily skilled in the art after reviewing the following detailed description and accompanying drawings, in which.

DETAILED DESCRIPTION OF PREFERRED EMBODIMENTS

Figure 1:
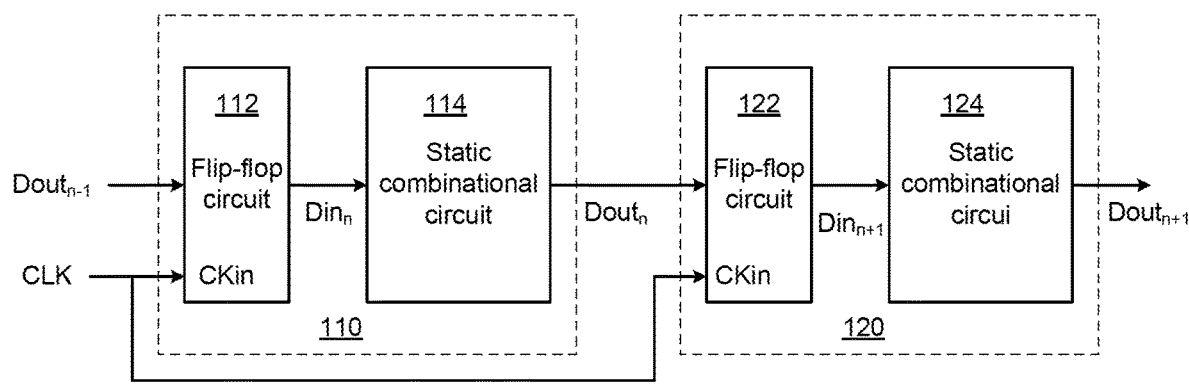
FIG. 1 (prior art) is a schematic circuit block diagram illustrating a conventional integrated circuit.
Figure 2:
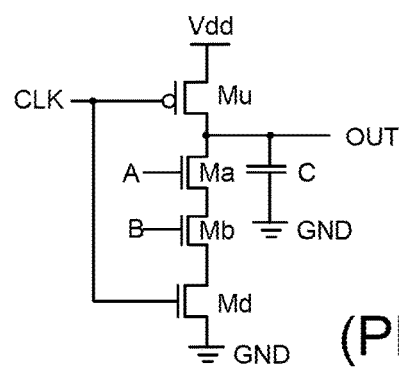
FIG. 2 (prior art) is a schematic circuit diagram illustrating a dynamic NAND gate.
Figure 3:
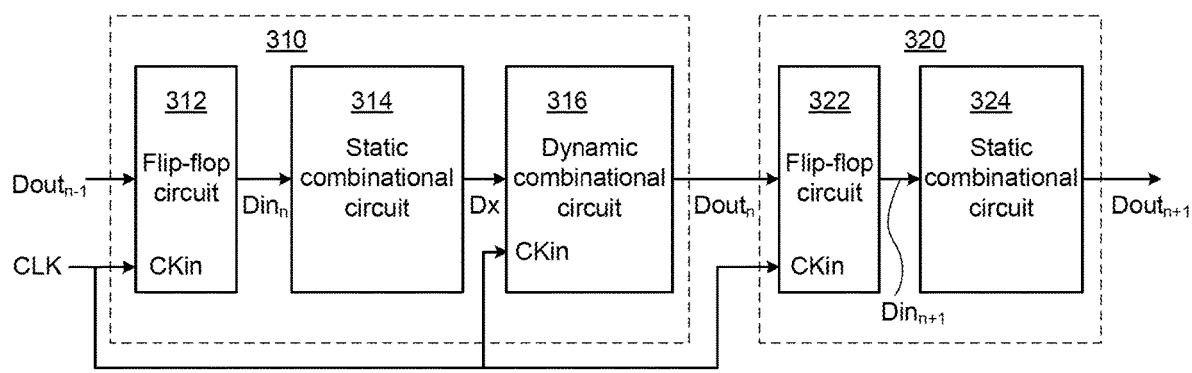
FIG. 3 is a schematic circuit diagram illustrating an integrated circuit with a mixed circuitry structure of a static combinational circuit and a dynamic combinational circuit.

The present invention provides an integrated circuit with a mixed circuitry structure of a static combinational circuit and a dynamic combinational circuit. In particular, at least one stage of the integrated circuit comprises a dynamic combinational circuit. FIG. 3 is a schematic circuit diagram illustrating an integrated circuit with a mixed circuitry structure of a static combinational circuit and a dynamic combinational circuit.

The circuit diagram of the integrated circuit comprises plural stages. For succinctness, only an n-th stage 310 and an (n+1)-th stage 320 are shown. These stages are operated according to a clock signal CLK. The n-th stage 310 comprises a flip-flop circuit 312, a static combinational circuit 314 and a dynamic combinational circuit 316. The (n+1)-th stage 320 comprises a flip-flop circuit 322 and a static combinational circuit 324. The clock input terminals CKin of the flip-flop circuits 312 and 322 receive the clock signal CLK. Moreover, each of the flip-flop circuits 312 and 322 comprises plural latches.

In the n-th stage 310, the flip-flop circuit 312 latches the output data $Dout_{n-1}$ of the previous stage as the input data $Din_n$. After the static combinational circuit 314 receives and processes the input data $Din_n$, an intermediate data Dx is generated. The clock input terminal CKin of the dynamic combinational circuit 316 receives the clock signal CLK. According to the clock signal CLK, the dynamic combinational circuit 316 receives and processes the intermediate data Dx. Consequently, the output data $Dout_n$ of the n-th stage 310 is generated.

Similarly, in the (n+1)-th stage 320, the flip-flop circuit 322 latches the output data $Dout_n$ of the n-th stage 310 as the input data $Din_{n+1}$. After the static combinational circuit 324 receives and processes the input data $Din_{n+1}$, the output data $Dout_{n+1}$ of the (n+1)-th stage 320 is generated.

The operation of the integrated circuit as shown in FIG. 3 will be described as follows. In the previous cycle of the clock signal CLK, the n-th stage 310 has to process the output data $Dout_{n-1}$ of the previous stage and generate the output data $Dout_n$ of the n-th stage 310. In the next cycle of the clock signal CLK, the (n+1)-th stage 320 has to process the output data $Dout_n$ of the n-th stage 310 and generate the output data $Dout_{n+1}$ of the (n+1)-th stage 320.

After the circuit diagram of FIG. 3 is designed, it is necessary to use an automatic placement and routing tool to perform a layout action. The automatic placement and routing too is also referred as an APR tool. The integrated circuit as shown in FIG. 3 has the mixed circuitry structure of a static combinational circuit and a dynamic combinational circuit. After the APR tool performs the clock tree balancing operation on the clock signal CLK, the clock signals CLK received by the clock input terminals CKin of all stages are synchronous with each other. In addition, the integrated circuit cannot be operated normally. The reasons will be described.

Generally, it takes a specified processing time from the time point of receiving the input data Dine to the time point of generating the intermediate data Dx. As mentioned above, the clock signal CLK received by the clock input terminal CKin of the flip-flop circuit 312 in the n-th stage 310 and the clock signal CLK received by the clock input terminal CKin of the dynamic combinational circuit 316 are synchronous with each other. When the dynamic combinational circuit 316 is enabled according to the clock signal CLK, the flip-flop circuit 312 is starting to latch the output data $Dout_{n-1}$. Consequently, it is determined that the intermediate data Dx of the static combinational circuit 314 is not ready. Since the dynamic combinational circuit 316 is unable to correctly receive the intermediate data Dx, the output data $Dout_n$ is generated incorrectly.

In order to solve the above problems and allow the integrated circuit to operate normally, the integrated circuit of the present invention is further equipped with a multi-phase generator. The multi-phase generator is used for dynamically adjusting the delay time of the clock signal. Consequently, the integrated circuit can be operated correctly.

Figure 4:
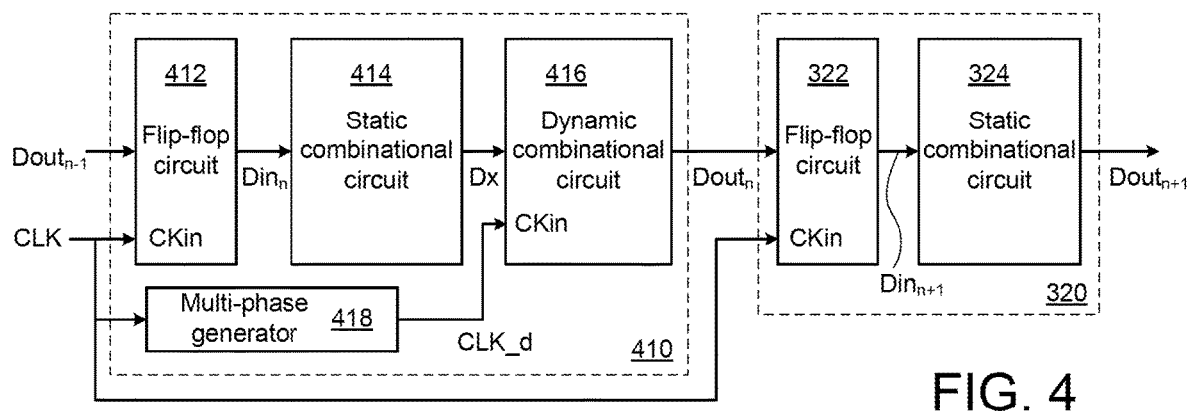
FIG. 4 is a schematic circuit diagram illustrating an integrated circuit with a mixed circuitry structure of a static combinational circuit and a dynamic combinational circuit according to an embodiment of the present invention.

FIG. 4 is a schematic circuit diagram illustrating an integrated circuit with a mixed circuitry structure of a static combinational circuit and a dynamic combinational circuit according to an embodiment of the present invention. The circuit diagram of the integrated circuit comprises plural stages. For succinctness, only an n-th stage 410 and an (n+1)-th stage 320 are shown. These stages are operated according to a clock signal CLK. The n-th stage 410 comprises a flip-flop circuit 412, a static combinational circuit 414, a multi-phase generator 418 and a dynamic combinational circuit 416. The structure of the (n+1)-th stage 320 is identical to that of FIG. 3, and not redundantly described herein. The clock input terminals CKin of the flip-flop circuits 412 and 322 receive the clock signal CLK. Moreover, each of the flip-flop circuits 412 and 322 comprises plural latches.

In the n-th stage 410, the data input terminal of the flip-flop circuit 412 receives the output data $Dout_{n-1}$ of the previous stage, and the output data $Dout_{n-1}$ is latched as the input data Dine. Moreover, the data output terminal of the flip-flop circuit 412 generates the input data Dine. After the static combinational circuit 414 receives and processes the input data Dine, an intermediate data Dx is generated. The multi-phase generator 418 receives the clock signal CLK and generated a delayed clock signal CLK_d. The clock input terminal CKin of the dynamic combinational circuit 416 receives the delayed clock signal CLK_d. The data input terminal of the dynamic combinational circuit 416 receives the intermediate data Dx. The data output terminal of the dynamic combinational circuit 416 generates the output data $Dout_n$. That is, according to the delayed clock signal CLK_d, the dynamic combinational circuit 416 receives and processes the intermediate data Dx. Consequently, the output data $Dout_n$ of the n-th stage 410 is generated.

Similarly, in the (n+1)-th stage 320, the data input terminal of the flip-flop circuit 322 receives the output data $Dout_n$ of the n-th stage 310, and the output data $Dout_n$ is latched as the input data $Din_{n+1}$. Moreover, the data output terminal of the flip-flop circuit 322 generates the input data $Din_{n+1}$. After the static combinational circuit 324 receives and processes the input data $Din_{n+1}$, the output data $Dout_{n+1}$ of the (n+1)-th stage 320 is generated.

Generally, it takes a specified processing time from the time point of receiving the input data Dine to the time point of generating the intermediate data Dx. The phase of the delayed clock signal CLK_d from the multi-phase generator 418 lags the clock signal CLK for at least the processing time. When the dynamic combinational circuit 416 is enabled according to the delayed clock signal CLK_d, it is determined that the intermediate data Dx of the static combinational circuit 414 is ready. Since the dynamic combinational circuit 416 is able to correctly receive the intermediate data Dx, the output data $Dout_n$ is generated correctly.

From the above descriptions, the associated signals are generated during the normal operation of the integrated circuit. In the previous cycle of the clock signal CLK, the n-th stage 410 processes the output data $Dout_{n-1}$ of the previous stage and generates the output data $Dout_n$ of the n-th stage 410. In the next cycle of the clock signal CLK, the (n+1)-th stage 320 processes the output data $Dout_n$ of the n-th stage 310 and generates the output data $Dout_{n+1}$ of the (n+1)-th stage 320.

Figure 5:
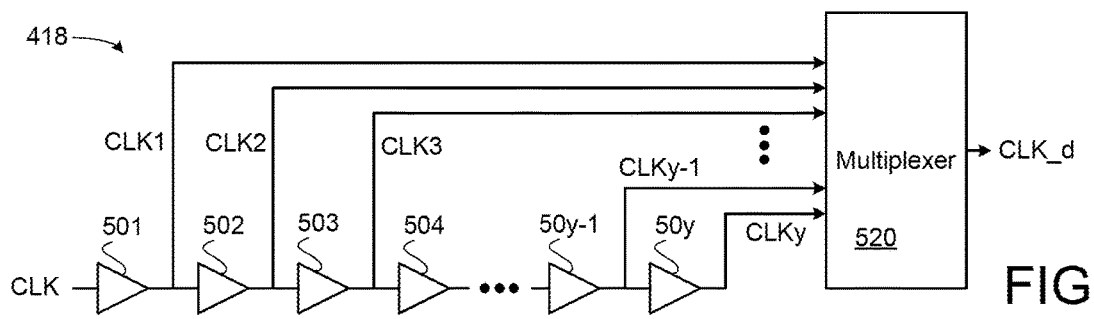
FIG. 5 is a schematic circuit diagram illustrating the multi-phase generator of the integrated circuit as shown in FIG. 4.

FIG. 5 is a schematic circuit diagram illustrating the multi-phase generator of the integrated circuit as shown in FIG. 4. The multi-phase generator 418 comprises plural serially-connected delay elements 501~50y and a multiplexer 520. Each of the delay elements 501~50y can delay the received clock signal for a unit delay time. The first delay element 501 receives the clock signal CLK and generates a clock signal CLK1. The second delay element 502 receives the clock signal CLK1 and generates a clock signal CLK2. The rest may be deduced by analogy. The y-th delay element 50y receives the clock signal CLKy-1 and generates a clock signal CLKy. The multiplexer 520 receives the clock signals CLK1~CLKy from the delay elements 501~50y. The output terminal of the multiplexer 520 is connected with one of plural input terminals of the multiplexer 520, and thus one of the clock signals CLK1~CLKy is selectively outputted. Consequently, the delayed clock signal CLK_d is outputted from the output terminal of the multiplexer 520. In other words, during the operation of the integrated circuit, a control circuit (not shown) of the integrated circuit selects the suitable delayed clock signal CLK_d to the dynamic combinational circuit 416 through the multiplexer 520 according to the processing time of the static combinational circuit 414.

Figure 6:
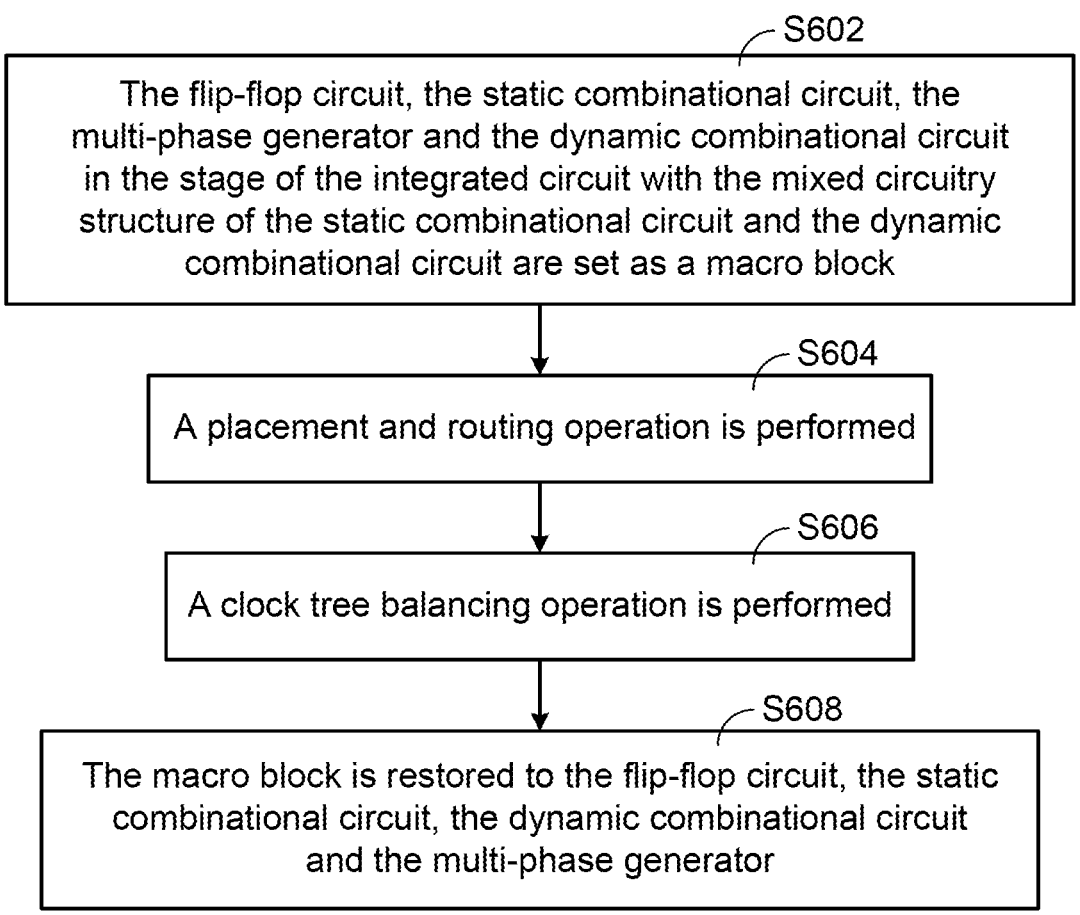
FIG. 6 is a flowchart of a designing method of the integrated circuit according to the embodiment of the present invention.

The present invention further comprises a designing method of the integrated circuit. FIG. 6 is a flowchart of a designing method of the integrated circuit according to the embodiment of the present invention.

After the circuit diagram of the integrated circuit is designed, the flip-flop circuit, the static combinational circuit, the multi-phase generator and the dynamic combinational circuit in the stage of the integrated circuit with the mixed circuitry structure of the static combinational circuit and the dynamic combinational circuit are set as a macro block (Step S602). In an embodiment, the macro block is considered as an electronic element. For example, as shown in FIG. 4, the flip-flop circuit 412, the static combinational circuit 414, the dynamic combinational circuit 416 and the multi-phase generator 418 are set as a macro block. The signal input terminals of the macro block receive the output data $Dout_{n-1}$ of the previous stage, the clock input terminal CKin of the macro block receives the clock signal CLK, and the signal output terminals of the macro block generate the output data $Dout_n$.

Then, the integrated circuit undergoes a placement and routing operation (Step S604). That is, the ARP tool is used to arrange the macro block and the other electronic elements of the (n+1)-th stage 320.

Then, the integrated circuit undergoes a clock tree balancing operation (Step S606). That is, the ARP tool is used to perform the clock tree balancing operation on the clock signal. Consequently, the clock signal CLK received by the clock input terminal CKin of the macro block and the clock signal CLK received by the clock input terminal CKin of the (n+1)-th stage are synchronous with each other.

Then, the macro block is restored to the flip-flop circuit 412, the static combinational circuit 414, the dynamic combinational circuit 416 and the multi-phase generator 418 (Step S608).

As mentioned above, the ARP tool is used to perform the clock tree balancing operation. In particular, the clock tree synthesis (CTS) operation performed by the ARP tool is only aimed at the clock input terminal of the macro block and the clock input terminals of other stages. In other words, the clock input terminal of the dynamic combinational circuit of the macro block is not subjected to the clock tree balancing operation by the ARP tool.

After the clock tree balancing operation is completed, the macro block is restored to the flip-flop circuit, the static combinational circuit, the dynamic combinational circuit and the multi-phase generator. Since the clock signal received by the clock input terminal of the dynamic combinational circuit and the clock signal received by the clock input terminal of the flip-flop circuit are not synchronous with each other, the integrated circuit can be operated normally.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. An integrated circuit with a mixed circuitry structure of a static combinational circuit and a dynamic combinational circuit, the integrated circuit comprising:
    a first stage receiving a previous stage output data and a clock signal, and generating a first output data; and
    a second stage receiving the first output data and the clock signal, and generating a second output data,
    wherein the first stage comprises a first flip-flop circuit, a first static combinational circuit, a dynamic combinational circuit and a multi-phase generator, wherein a data input terminal of the first flip-flop circuit receives the previous output data, a clock input terminal of the first flip-flop circuit receives the clock signal, a data output terminal of the first flip-flop circuit generates an input data, the first static combinational circuit receives the input data and generates an intermediate data, the multi-phase generator receives the clock signal and generates a delayed clock signal, a data input terminal of the dynamic combinational circuit receives the intermediate data, a clock input terminal of the dynamic combinational circuit receives the delayed clock signal, and a data output terminal of the dynamic combinational circuit generates the first output data.

2. The integrated circuit as claimed in claim 1, wherein the second stage comprises a second flip-flop circuit and a second static combinational circuit, wherein a data input terminal of the second flip-flop circuit receives the first output data, a clock input terminal of the second flip-flop circuit receives the clock signal, a data output terminal of the second flip-flop circuit is connected with a data input terminal of the second static combinational circuit, and a data output terminal of the second static combinational circuit generates the second output data.

3. The integrated circuit as claimed in claim 1, wherein in a first cycle of the clock signal, the first stage processes the previous output data and generates the first output data, wherein in a second cycle of the clock signal, the second stage processes the first output data and generates the second output data.

4. The integrated circuit as claimed in claim 1, wherein the multi-phase generator comprises plural serially-connected delay elements and a multiplexer, wherein a first delay element of the plural delay elements receives the clock signal, output terminals of the plural delay elements are connected with plural input terminals of the multiplexer, and an output terminal of the multiplexer is selectively connected with one of the plural input terminals to generate the delayed clock signal.

5. A designing method of the integrated circuit according to claim 1, the designing method comprising steps of:
    setting the first flip-flop circuit, the first static combinational circuit, the dynamic combinational circuit and the multi-phase generator of the first stage as a macro block;
    performing a placement and routing operation on the integrated circuit;
    performing a clock tree balancing operation on the integrated circuit; and
    restoring the macro block to the flip-flop circuit, the static combinational circuit, the dynamic combinational circuit and the multi-phase generator.

6. The designing method as claimed in claim 5, wherein while the placement and routing operation is performed, the macro block and plural electronic elements of the second stage are arranged through an automatic placement and routing tool.

7. The designing method as claimed in claim 5, wherein plural signal input terminals of the macro block receive the previous stage output data, a clock input terminal of the macro block receives the clock signal, and plural signal output terminals of the macro block generate the first output data.

8. The designing method as claimed in claim 7, wherein while the clock tree balancing operation is performed, an automatic placement and routing tool performs a clock tree synthesis operation, so that the clock signal received by the clock input terminal of the macro block and the clock signal received by a clock input terminal of the second stage are synchronous with each other.

* * * * *